United States Patent
Jung et al.

(10) Patent No.: US 6,535,040 B2
(45) Date of Patent: Mar. 18, 2003

(54) DUTY CYCLE CORRECTION CIRCUITS THAT REDUCE DISTORTION CAUSED BY MISMATCHED TRANSISTOR PAIRS

(75) Inventors: Yeon-jae Jung, Kyungsangnam-do (KR); Chang-sik Yoo, Kyungki-do (KR); Kee-wook Jung, Seoul (KR); Won-chan Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/929,522

(22) Filed: Aug. 14, 2001

(65) Prior Publication Data

US 2002/0079941 A1 Jun. 27, 2002

(30) Foreign Application Priority Data

Aug. 14, 2000 (KR) ......................................... 2000-46938

(51) Int. Cl.$^7$ ............................................... H03K 3/017
(52) U.S. Cl. ...................... 327/175; 327/51; 327/170; 331/40; 365/208
(58) Field of Search .................................. 327/172–175, 327/170, 51, 52–53, 54, 55–57, 178, 180, 295, 35; 365/195, 196, 205–207, 208; 331/40

(56) References Cited

U.S. PATENT DOCUMENTS

| | | | | |
|---|---|---|---|---|
| 4,958,133 A | | 9/1990 | Bazes | 330/253 |
| 5,155,397 A | * | 10/1992 | Fassino et al. | 327/54 |
| 5,309,047 A | * | 5/1994 | Tiede et al. | 327/208 |
| 5,572,158 A | | 11/1996 | Lee et al. | 327/175 |
| 5,994,939 A | | 11/1999 | Johnson et al. | 327/280 |
| 6,169,424 B1 | * | 1/2001 | Kurd | 327/53 |

* cited by examiner

*Primary Examiner*—Minh Nguyen
(74) *Attorney, Agent, or Firm*—Myers Bigel Sibley & Sajovec

(57) ABSTRACT

A duty cycle correction circuit includes a duty cycle corrector and a detection circuit. The duty cycle corrector generates a first input signal having a second duty cycle with a higher degree of equivalence than the first duty cycle in response to a first detection signal and a first control signal having a first duty cycle. The detection circuit generates the first detection signal in response to the first input signal. The detection circuit includes a current source having first and second current sources and a bias circuit that is electrically coupled to the first and second current sources and controls a bias of the first and the second current sources responsive to the first input signal.

15 Claims, 2 Drawing Sheets

DUTY CYCLE CORRECTION CIRCUITS THAT REDUCE DISTORTION CAUSED BY MISMATCHED TRANSISTOR PAIRS

RELATED APPLICATIONS

This application claims the benefit of Korean Application No. 2000-46938, filed Aug. 14, 2000, the disclosure of which is hereby incorporated herein by reference.

FIELD OF THE INVENTION

The present invention relates to semiconductor devices, and more particularly, to duty cycle correction circuits.

BACKGROUND OF THE INVENTION

Recently, the speed of semiconductor memory devices, for example, dynamic random access memories (DRAMs), has increased to improve the performance of existing systems. However, increasing demand for improved systems may require DRAMs that can process even more data at even higher speeds. Accordingly, synchronous dynamic random access memories (SDRAMs) that operate in synchronization with system clocks have been developed for a high-speed operation, thus significantly increasing data transmission speeds.

There are limitations on the amount of data that may be input to and/or output from a memory device per clock cycle of a system clock. To address these limitations, dual data rate (DDR) SDRAMs have been recently developed in order to further increase the transmission speed of data. DDR SDRAMS input and/or output data in synchronization with both the rising edge and the falling edge of a clock.

Reliable data transmission is possible when the duty cycle of a clock signal is equivalent at 50%, which is ideal, in a DDR SDRAM or a direct rambus dynamic random access memory (RDRAM). Thus, when a signal having a duty cycle that is not equivalent, i.e. greater than or less than 50%, is provided as an input, the signal typically does not perform very well as an input signal. Duty cycle correction circuits have been developed to address this problem.

A block diagram of a conventional duty cycle correction circuit is illustrated in FIG. 1. A duty cycle correction circuit includes a duty cycle corrector 10 and a detection circuit 13. The duty cycle corrector 10 generates a pair of complementary input signals IN and INB, from which distortion is typically removed, in response to first and second complementary clock signals CLK and CLKB, having distortion resulting from nonequivalent duty cycles. The detection circuit 13 feeds back first and second detection signals DETECT and DETECTB obtained by detecting distortion in the duty cycles of the complementary pair of input signals IN and INB of the correction circuit 10 in response to the pair of complementary input signals IN and INB.

Now referring to FIG. 2, a circuit diagram of a conventional detection circuit 13 of FIG. 1 will be discussed. When mismatching exists among diode-connected loads M1 and M4, cross-coupled loads M2 and M3, source coupled pairs M5 and M6, and/or the respective transistors in the detection circuit 13, increased distortion may occur in the duty cycles of the pair of complementary input signals IN and INB due to mismatching of the respective transistors, even though less distortion is present in the duty cycles of the complementary pair of clock signals CLK and CLKB.

SUMMARY OF THE INVENTION

Semiconductor devices according to embodiments of the present invention include a duty cycle correction circuit having a duty cycle corrector and a detection circuit. The duty cycle corrector generates a first input signal having a second duty cycle with a higher degree of equivalence than the first duty cycle in response to a first detection signal and a first control signal having a first duty cycle. The detection circuit generates the first detection signal in response to the first input signal. The detection circuit includes a current source having first and second current sources and a bias circuit that is electrically coupled to the first and second current sources and controls a bias of the first and the second current sources responsive to the first input signal.

In some embodiments of the present invention, the duty cycle corrector further generates a second input signal having a fourth duty cycle with a higher degree of equivalence than the third duty cycle in response to a second detection signal and a second control signal having a third duty cycle. The detection circuit, in other embodiments of the present invention, further generates the second detection signal in response to the second input signal.

In further embodiments of the present invention, the duty cycle correction circuit includes a load matching circuit that is electrically coupled to the first and second current sources and matches a load of the bias circuit in response to the second input signal.

In still further embodiments of the present invention, the first control signal is a true clock signal and the second control signal is a complementary clock signal. Furthermore, the first and second input signals are complementary signals and the first and second detection signals are complementary signals.

In some embodiments of the present invention, the duty cycle correction circuit further includes a first output driver circuit that pulls the first detection signal up or down in response to the first input signal and a second output driver circuit that pulls a second detection signal up or down in response to a second input signal. The current generated by the current source is supplied to the first output driver circuit, the second output driver circuit and the bias circuit responsive to a bias voltage. The bias voltage may be a voltage at a first node during a period and is calculated according to the equation $V_{NODB}+V_{NODC}-VDD-GND$. $V_{NODB}$ is the voltage at a second node, $V_{NODC}$ is the voltage at a third node, VDD is a source voltage, and GND is a ground voltage.

DETAILED DESCRIPTION OF THE INVENTION

Figure 1:
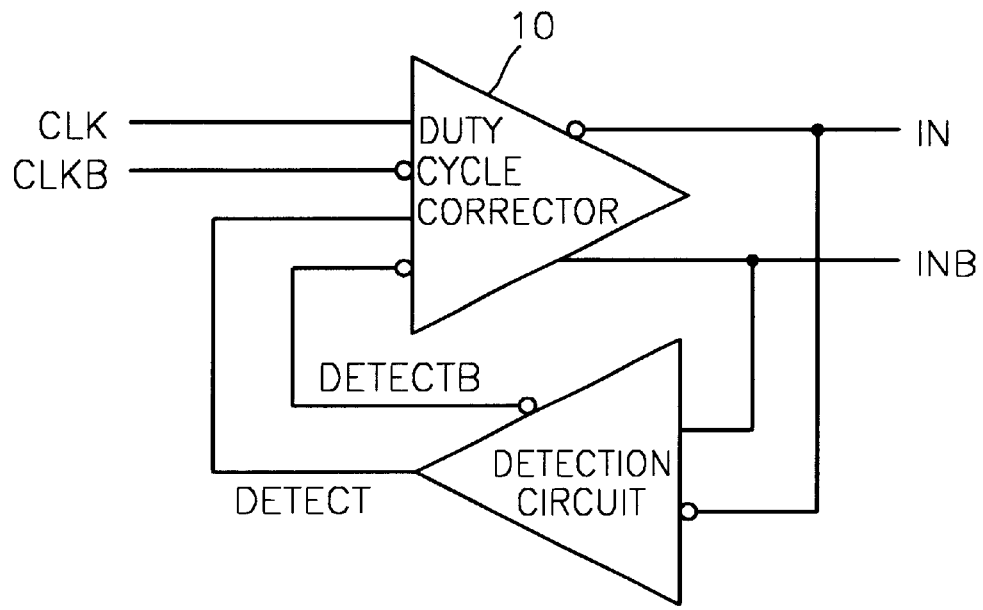
FIG. 1 is a block diagram illustrating a conventional duty cycle correction circuit.
Figure 2:
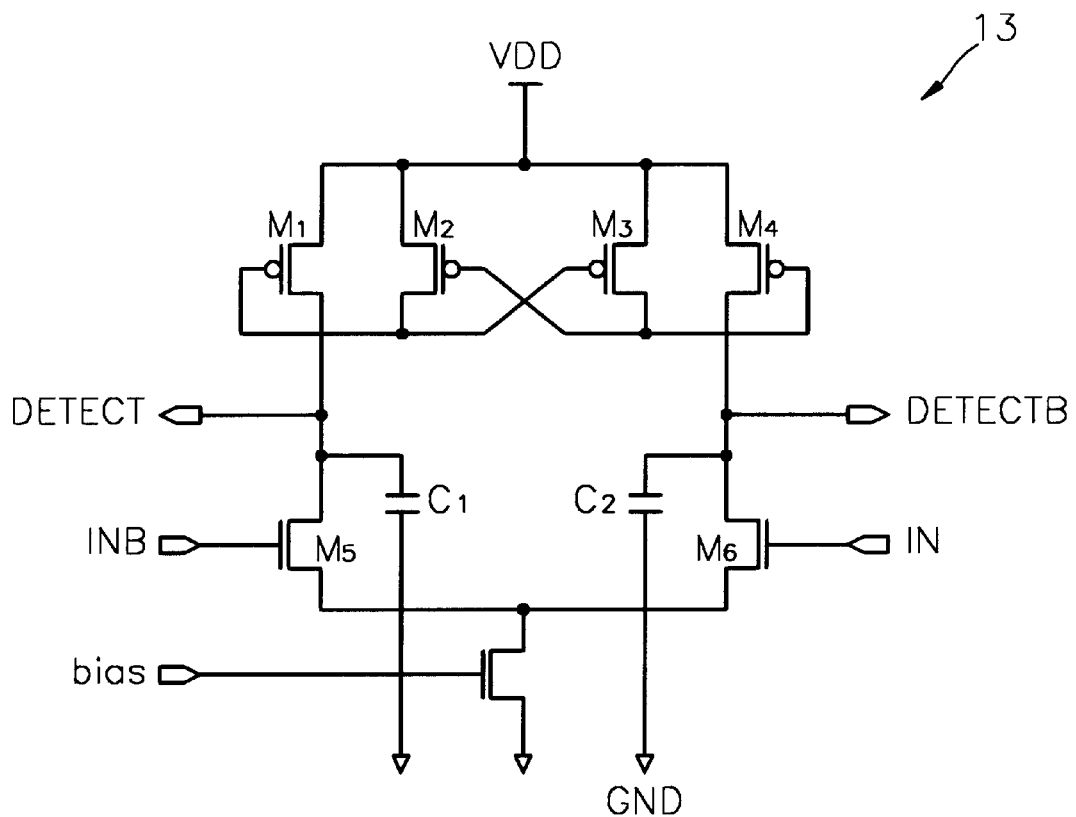
FIG. 2 is a circuit diagram illustrating a conventional detection circuit of FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein; rather these embodiments are provided so that this disclosure will be thorough and complete, and will fully convey the scope of the invention to those skilled in the art. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Signal lines and signal thereon may be referred to by the same reference names. Like numbers refer to like elements throughout.

Now referring to FIG. 3, a circuit diagram of a detection circuit 13A according to embodiments of the present invention will be discussed. It will be understood that the detection circuit 13A receives a pair of complementary input signals IN and INB that are generated by a duty cycle corrector, for example, duty cycle corrector 10, in response to a pair of complementary clock signals CLK and CLKB. It will be further understood that although the inputs of the duty cycle corrector are described herein as a complementary pair of clock signals, the present invention is not limited to this configuration. For example, the inputs to the duty cycle corrector may be a complementary pair of control signals CNTL and CNTLB. The detection circuit 13A includes a first output driver 31, a bias circuit 33, a current source 35, a second output driver 39, and a load matching circuit 37.

The first output driver 31 pulls a first detection signal DETECT up or down in response to a complementary input signal INB. The first output driver 31 may include a PMOS transistor M3 and an NMOS transistor M1 that are electrically connected as illustrated in FIG. 3. In particular, the drains of transistors M3 and M1 are connected together and the complementary input signal INB is applied to the gates of transistors M3 and M1. Furthermore, the first detection signal DETECT is connected to the drain of the PMOS transistor M3 and a first capacitor C1 may be electrically connected between the first detection signal line DETECT and ground GND.

The second output driver 39 pulls a second detection signal DETECTB up or down in response to an input signal IN. The second output driver 39 may include a PMOS transistor M4 and an NMOS transistor M2 that are electrically connected as illustrated in FIG. 3. In particular, the drains of transistors M4 and M2 are connected together and the input signal IN is applied to the gates of transistors M4 and M2. Furthermore, the second detection signal DETECTB is electrically connected to the drain of the PMOS transistor M4 and a second capacitor C2 may be electrically connected between the second detection signal line DETECTB and ground GND.

The current source 35 steers current to the first output driver 31, the second output driver 39, and the bias circuit 33, in response to a bias voltage. The bias voltage is the voltage of a node NODA. The current source 35 may include first and second current source transistors, PMOS transistor M11 and NMOS transistor M9, respectively. First and second current source transistors M11 and M9 are electrically connected as illustrated in FIG. 3.

The detection circuit 13A according to embodiments of the present invention has a structure, in which the source coupled pair of the NMOS transistors M1 and M2 and the source coupled pair of the PMOS transistors M3 and M4 are stacked. The current steering capability of the source coupled pairs is used in the structure to steer current to one side of the detection circuit 13A. Thus, the degree of deterioration of the characteristics of a transistor in the detection circuit 13A due to mismatching of the processes of the transistors M1 and M2 and/or M3 and M4 used for the source coupled pairs may be reduced.

When the bias of the first and second current source transistors M9 and M11, which operate as the current source 35, is provided from outside of the duty cycle detection circuit the level of the first or second detection signal DETECT or DETECTB, which are a complementary pair of detection signals, is saturated to the source voltage VDD or the ground voltage GND. This is called the common mode problem. Accordingly, embodiments of the present invention include a self-bias circuit located within the detection circuit 13A in order to reduce the distortion introduced by the common mode problem.

Figure 3:
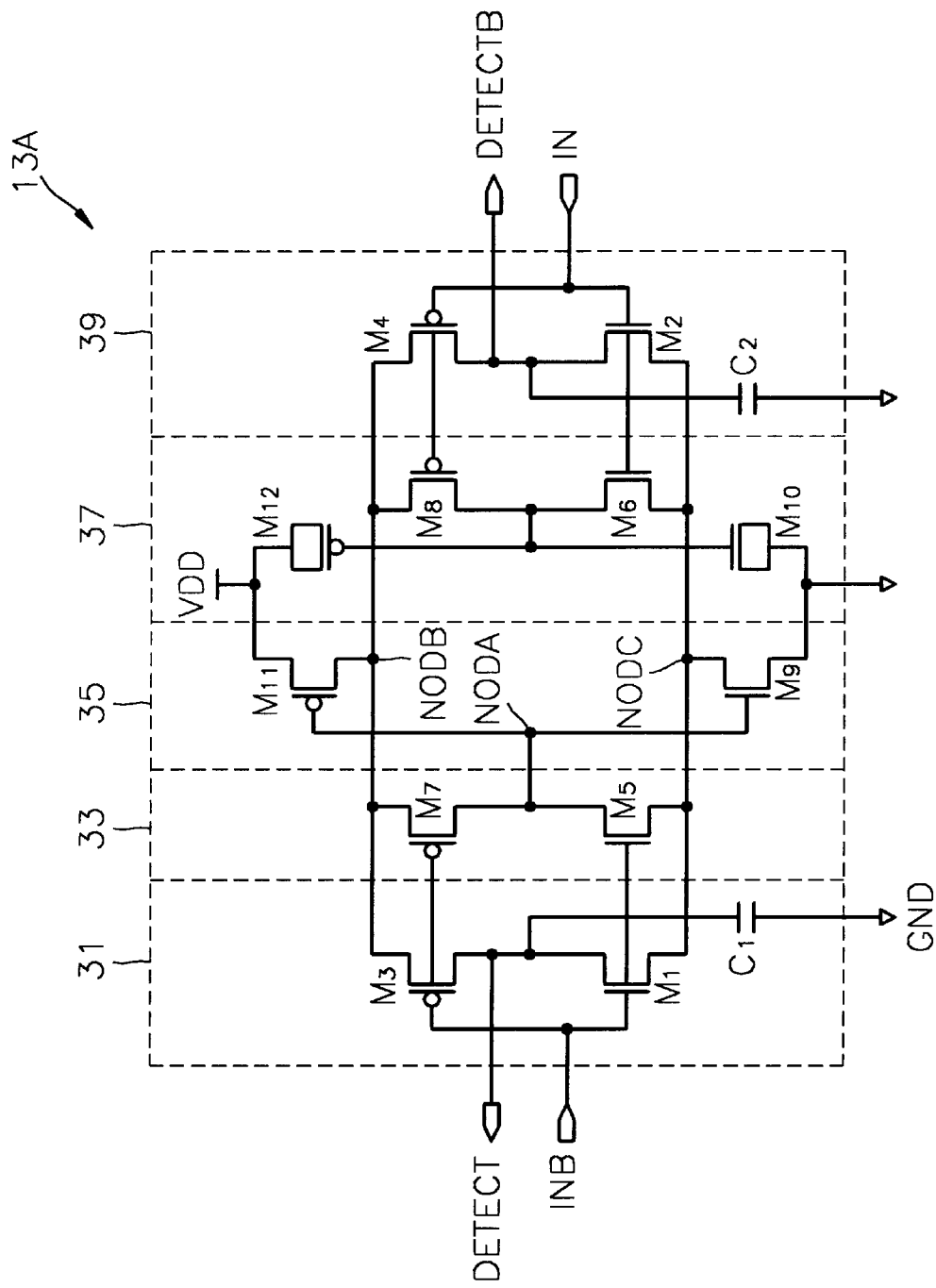
FIG. 3 is a circuit diagram illustrating a detection circuit according to embodiments of the present invention.

A self-bias circuit 33 according to embodiments of the present invention includes a PMOS transistor M7 and an NMOS transistor M5 that are electrically connected as illustrated in FIG. 3. In particular, the drains of transistor the PMOS transistor M7 and NMOS transistor M5 are electrically connected together and the complementary input signal INB is applied to the gates of transistor the PMOS transistor M7 and the NMOS transistor M5. The NMOS transistor M5 and the PMOS transistor M7, which operate as the self-bias circuit 33, dynamically determine the bias of the NMOS transistor M9 and the PMOS transistor M11 of the current source 35 according to the complementary input signal INB. Since the bias circuit 33 does not need to operate at high speed, the ratio of the width to the length (W/L) may be small.

A load matching circuit 37 is provided to compensate for the mismatch of load caused by adding the self-bias circuit 33 to the detection circuit 13A. The load matching circuit 37 includes a PMOS transistor M8, an NMOS transistor M6, a PMOS transistor M12 and an NMOS transistor M10 that are electrically connected as illustrated in FIG. 3. The characteristics of the NMOS transistor M6 may be similar to the characteristics of the NMOS transistor M5 of the self-bias circuit 33. Similarly, the characteristics of the PMOS transistor M8 may be similar to the characteristics of the PMOS transistor M7 of the self-bias circuit 33. Furthermore, the characteristics of the NMOS transistor M10 may be similar to the characteristics of the NMOS transistor M9 and the characteristics the PMOS transistor M12 may be similar to the characteristics of the PMOS transistor M11 of the current source 35.

The operation of the detection circuit 13A according to embodiments of the present invention will now be described. Since the input signal IN and the complementary input signal INB are a pair of complementary input signals, operations will only be discussed with respect to the complementary input signal INB.

When the complementary input signal INB is at the supply voltage VDD, transistors M1 and M5 are turned on and transistors M3 and M7 are turned off. This causes transistor M5 to sink current from the first node NODA in an amount that is proportional to the difference between the source voltage VDD and the voltage $V_{NODC}$ of the third node NODC, i. e. $VDD-V_{NODC}$. On the other hand, when the complementary input signal INB is at the ground voltage GND, transistors M1 and M5 are turned off and transistors M3 and M7 are turned on. This causes transistor M7 to supply current to the first node NODA in an amount that is proportionate to the difference between the ground GND and the voltage $V_{NODB}$ of the second node NODB, i. e $V_{NODB}-$GND.

Accordingly, net current, which is proportional to the equation:

$$T_{INB-H} \times (V_{NODC} - VDD) + T_{INB-L} \times (V_{NODB} - GND) \qquad (1)$$

where TINB-H equals a period that the complementary input signal INB is at a logic high level and where TINB-L equals a period that the complementary input signal INB is at a logic low level, is supplied to the first node NODA every period. When the duty cycle correction circuit 10 is in a steady state, the duty cycle is corrected, i.e. the duty cycle is equivalent. Therefore, the period that the complementary input signal is at the logic high level is equal to the period that the complementary input signal is at the logic low level. Accordingly, a net current, which is proportionate to $V_{NODB}+V_{NODC}-VDD-GND$, is supplied to the first node NODA every period. The amount of the net current is positive when the values of $V_{NODB}$ and $V_{NODC}$ are high. Accordingly, when the values of $V_{NODB}$ and $V_{NODC}$ are high, the voltage of the first node NODA increases. Similarly, the amount of the net current is negative when the values of $V_{NODB}$ and $V_{NODC}$ are low, thus reducing the voltage of the first node NODA.

If the current through current source transistor M11 is larger than the current through current source transistor M9, the voltages $V_{NODB}$ and $V_{NODC}$ of nodes NODB and NODC, respectively, increase. Accordingly, the current through current source transistor M11 is reduced and the current through current source transistor M9 increases. However, when the current through current source transistor M1 is smaller than the current through current source transistor M9, the voltages $V_{NODB}$ and $V_{NODC}$ of nodes NODB and NODC, respectively, are reduced. Accordingly, the current through current source transistor M11 increases and the current through current source transistor M9 is reduced. As a result, the detection circuit 13A operates such that the amount of the current through transistor M11 is typically the same as the amount of the current through transistor M9, thus reducing distortion caused by mismatched transistors and providing an equivalent duty cycle.

As described above, a duty cycle correction circuit according to embodiments of the present invention may reduce the deterioration of the performance of the detection circuit caused by mismatched transistors and makes it is possible to correctly detect the duty cycle of the complementary input signals. In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A duty cycle correction circuit, comprising:
   a duty cycle corrector that in response to a first detection signal and a first control signal having a first duty cycle, generates a first input signal having a second duty cycle with a higher degree of equivalence than the first duty cycle; and
   a detection circuit that generates the first detection signal in response to the first input signal, said detection circuit comprising:
      a current source including first and second current source transistors;
      a bias circuit that is electrically coupled to the first and second current source transistors and controls a bias voltage of the first and the second current source transistors responsive to the first input signal; and
      a load matching circuit that is electrically coupled to the first and second current source transistors and matches a load of the bias circuit in response to a second input signal.

2. A duty cycle correction circuit, comprising:
   a duty cycle corrector that in response to a first detection signal and a first control signal having a first duty cycle, generates a first input signal having a second duty cycle with a higher degree of equivalence than the first duty cycle and in response to a second detection signal and a second control signal having a third duty cycle, generates a second input signal having a fourth duty cycle with a higher degree of equivalence than the third duty cycle; and
   a detection circuit that generates the first detection signal in response to the first input signal and the second detection signal in response to the second input signal, said detection circuit comprising:
      a current source including first and second current source transistors;
      a bias circuit that is electrically coupled to the first and second current source transistors and controls a bias voltage of the first and the second current source transistors responsive to the first input signal; and
      a load matching circuit that is electrically coupled to the first and second current source transistors and matches a load of the bias circuit in response to the second input signal.

3. A duty cycle correction circuit according to claim 2:
   wherein the first control signal is a clock signal and the second control signal is a complementary clock signal.

4. A duty cycle correction circuit according to claim 2:
   wherein the first and second input signals are complementary signals; and
   wherein the first and second detection signals are complementary signals.

5. A duty cycle correction circuit according to claim 2, wherein the detection circuit further comprises:
   a first output driver circuit that pulls the first detection signal up or down responsive to the first input signal; and
   a second output driver circuit that pulls the second detection signal up or down responsive to the second input signal.

6. A duty cycle correction circuit according to claim 5, wherein a current generated by the current source is supplied to the first output driver circuit, the second output driver circuit and the bias circuit responsive to the bias voltage.

7. A duty cycle correction circuit according to claim 6, wherein the bias voltage is a voltage at a first node ($V_{NODA}$) during a period and is calculated according to the equation $V_{NODB}+V_{NODC}-VDD-GND$, wherein $V_{NODB}$ is the voltage at a second node, $V_{NODC}$ is the voltage at a third node, VDD is a source voltage, and GND is a ground voltage.

8. A duty cycle detection circuit, comprising:
   a first output driver for pulling up or down a first signal at a first output node of the first output driver in response to a first input signal;
   a bias circuit for controlling a bias voltage in response to the first input signal;
   a second output driver for pulling up or down a second signal at a second output node of the second output driver in response to a second input signal; and
   a current source for flowing current to the first output driver, the second output driver, and the bias circuit, in response to the bias voltage.

9. The circuit of claim 8, wherein the duty cycle detection circuit further comprises a load matching circuit connected to the current source, the load matching circuit for load matching with the bias circuit,
   and wherein the load matching circuit operates in response to the second input signal.

10. The circuit of claim 9, wherein the first output driver comprises:
- a first MOS transistor, whose source is connected to a first node and to whose gate the first input signal is applied; and
- a second MOS transistor, to whose drain the drain of the first MOS transistor is connected, to whose gate the first input signal is applied, and whose source is connected to a second node,
- wherein the first output node is connected to the drain of the first MOS transistor.

11. The circuit of claim 10, wherein the bias circuit comprises:
- a third MOS transistor, whose source is connected to the first node and to whose gate the first input signal is applied; and
- a fourth MOS transistor, to whose drain the drain of the third MOS transistor is connected, to whose gate the first input signal is applied, and whose source is connected to the second node.

12. The circuit of claim 11, wherein the current source comprises:
- a fifth MOS transistor, whose source is connected to a source voltage, to whose gate the drain of the third MOS transistor is connected, to whose drain the first node is connected; and
- a sixth MOS transistor, to whose drain the second node is connected, to whose gate the drain of the third MOS transistor is connected, and whose source is connected to the ground.

13. The circuit of claim 9, wherein the duty cycle detection circuit further comprises a first capacitor between the first output node and ground and a second capacitor between the second output node and the ground.

14. The circuit of claim 11, wherein the second output driver comprises:
- a seventh MOS transistor, whose source is connected to the first node and to whose gate the second input signal is applied; and
- an eighth MOS transistor, to whose drain the drain of the seventh MOS transistor is connected, to whose gate the second input signal is applied, and whose source is connected to the second node,
- wherein the second output node is connected to the drain of the seventh MOS transistor.

15. The circuit of claim 14, wherein the load matching circuit comprises:
- a ninth MOS transistor, whose source is connected to the first node and to whose gate the second input signal is applied;
- a tenth MOS transistor, to whose drain the drain of the ninth MOS transistor is connected, to whose gate the second input signal is applied, and whose source is connected to the second node;
- an eleventh MOS transistor, whose drain and source are commonly connected to a source voltage and to whose gate the drain of the ninth MOS transistor is connected; and
- a twelfth MOS transistor, whose drain and source are commonly connected to a ground voltage and to whose gate the drain of the ninth MOS transistor is connected.

* * * * *